United States Patent
Lee et al.

(10) Patent No.: US 7,498,252 B2
(45) Date of Patent: Mar. 3, 2009

(54) DUAL LAYER DIELECTRIC STACK FOR MICROELECTRONICS HAVING THICK METAL LINES

(75) Inventors: Kevin J. Lee, Beaverton, OR (US); Subhash Joshi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 61 days.

(21) Appl. No.: 11/540,350

(22) Filed: Sep. 29, 2006

(65) Prior Publication Data

US 2008/0081459 A1    Apr. 3, 2008

(51) Int. Cl.
*H01L 21/4763* (2006.01)
(52) U.S. Cl. .................. 438/618; 438/626; 438/672; 438/513; 257/E21.218; 257/E21.229; 257/E21.267; 257/E21.585

(58) Field of Classification Search .................. 438/618, 438/597, 637, 672, 626, 513, 9, 753, 754, 438/706, 745
See application file for complete search history.

(56) References Cited

U.S. PATENT DOCUMENTS

| 5,856,705 A * | 1/1999 | Ting .......................... 257/758 |
| 5,950,102 A * | 9/1999 | Lee ............................ 438/619 |
| 6,255,675 B1 * | 7/2001 | Trimberger ................. 257/208 |
| 6,426,545 B1 * | 7/2002 | Eichelberger et al. ....... 257/633 |
| 6,673,698 B1 * | 1/2004 | Lin et al. ..................... 438/459 |
| 6,943,440 B2 * | 9/2005 | Kim et al. ................... 257/690 |
| 2005/0051904 A1 * | 3/2005 | Kim et al. ................... 257/777 |

* cited by examiner

*Primary Examiner*—David Nhu
(74) *Attorney, Agent, or Firm*—Kenneth A. Nelson

(57) ABSTRACT

Embodiments of the invention include apparatuses and methods relating to dual layer dielectric stacks for thick metal lines of microelectronic devices. In one embodiment, the dual layer dielectric stack includes a first dielectric layer that is planar and mechanically strong and the second dielectric layer can be patterned by photolithography to the required critical dimensions.

13 Claims, 2 Drawing Sheets

DUAL LAYER DIELECTRIC STACK FOR MICROELECTRONICS HAVING THICK METAL LINES

TECHNICAL FIELD

Embodiments of the invention relate to microelectronics processing technology. In particular, embodiments of the invention relate to microelectronic devices having thick metal lines.

BACKGROUND

In semiconductor processing technology, transistors and other electrical components are fabricated on a suitable substrate and interconnected to form integrated circuits (ICs), which perform numerous useful functions. The transistors and other devices are typically interconnected with each other and external circuitry by multiple layers of metal lines and through vias which are formed over the transistors and other devices. In some applications, each layer of metal lines has larger and thicker lines as they are stacked over the transistors, such that the first layer has the smallest metal lines and the last layer has the largest metal lines. The metal lines and vias are often surrounded by dielectric materials that provide insulation and reduce capacitance between adjacent lines. Frequently, the last layer of metal lines are contacted by vias and bumps such that the IC can be flip-chip connected to a package substrate having external circuitry.

To reduce the resistance of the metal lines and to thereby reduce voltage drop in the IC, thicker metal lines have been proposed, particularly in those layers that are higher in the stack over the transistors, and often for those at the highest layer in the stack. Incorporating thicker metal lines at or near the highest stack layer has numerous difficulties. In some current processes, for example, a single photosensitive dielectric material is formed over the metal lines, and then the dielectric material is patterned to open via holes for contact to the metal lines. For successful fabrication, the photosensitive dielectric material must provide sufficient planarity over the metal lines to provide a relatively flat surface (without bulges over the metal lines) and must be able to be patterned to the necessarily small dimensions required to contact the metal lines. However, for thick metal lines, currently available materials either do not provide adequate planarity, or they cannot be patterned to sufficiently small dimensions. Further, many of the proposed materials do not provide the mechanical strength necessary to reliably flip-chip package the IC to a package substrate.

BRIEF DESCRIPTION OF THE DRAWINGS

The invention is illustrated by way of example and not by way of limitation in the figures of the accompanying drawings, in which the like references indicate similar elements and in which.

DETAILED DESCRIPTION

In various embodiments, apparatuses and methods relating to dual layer dielectric material stacks for thick metal lines are described. However, various embodiments may be practiced without one or more of the specific details, or with other methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without the specific details described. Furthermore, it is understood that the various embodiments shown in the figures are illustrative representations and are not necessarily drawn to scale.

In some microelectronic products, it is desirable to provide relatively thick metal lines at or near the highest level of the stack of metal line layers. Such thick metal lines provide less electrical resistance than relatively thin metal lines and thereby reduce voltage drop in the microelectronic system. Further, it is desirable to surround the metal lines with dielectric materials to electrically insulate them. The thick metal lines are contacted by conductive vias through the dielectric materials. The conductive vias interconnect the thick metal lines to either higher levels of metal lines or to conductive lands or bumps (for connection to external packaging systems).

Briefly, the present description provides structures and methods that enable the use of thicker metal lines integrated on microelectronic devices with a dielectric material stack that is planar, includes a layer that is definable by photolithography, and has good mechanical properties. After the formation of relatively thick metal lines, a first dielectric material is deposited over the metal lines. The first dielectric layer is relatively planar and shrinks minimally during cure. Then, a second dielectric layer is deposited over the first dielectric layer. The second dielectric layer can be patterned by photolithography, and is so patterned to form an opening in the second dielectric layer over the thick metal line. Next, the first dielectric layer is etched to expose the metal line. A conductive via is then formed in the opening along with either a higher level metal line or a bump or land for connection to a package substrate.

FIGS. 1-3 and 5-7 illustrate methods and structures for thick metal lines having a dual dielectric stack. FIGS. 4A and 4B illustrate examples of non-planar and planar layers over bodies on a substrate.

Figure 1:
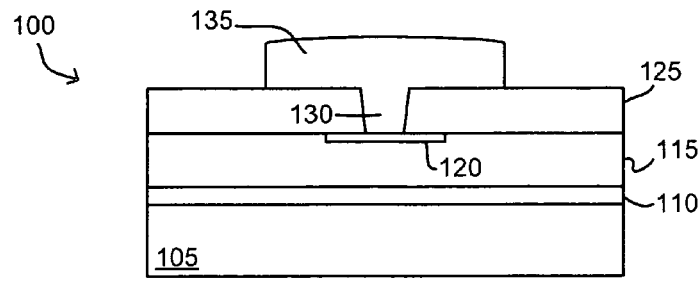
FIG. 1 is a cross-sectional illustration of a portion of a microelectronic die, including a substrate, a device layer, an interconnect region including a metal line, a via connected to the metal line, a thick metal line connected to the via, and a dielectric layer over the interconnect region and surrounding the via.

FIG. 1 illustrates a portion of a microelectronic die 100 including a substrate 105, a device layer 110, an interconnect region 115, a metal line 120, a dielectric layer 125, a via 130, and a thick metal line 135.

In general, the die may be part of a wafer having a plurality of dice or the die may be an individual and separate integrated circuit. Substrate 105 includes any suitable semiconductive material or materials for the formation of operative devices. For example, substrate 105 may include monocrystalline silicon, germanium, gallium arsenide, indium phosphide, or silicon on insulator, or the like. Device layer 110 includes devices formed in and on substrate 105, such as transistors, resistors, or conductors, that form an integrated circuit.

Interconnect region 115 provides electrical interconnection for the devices of device layer 110. Interconnect region 115 includes a stack of metallization layers which include metal lines that are separated and insulated by interlayer dielectric (ILD) materials. The metal lines of the metallization layer are interconnected by conductive vias which are also separated and insulated by dielectric materials. The ILD materials include any suitable insulative materials, including low-k ILD materials, which have a dielectric constant, k, of less than that of silicon dioxide (less than about 4).

Metal line 120 is electrically connected to one or more of the metal lines and vias of interconnect region 115 and is part of the top metallization layer of interconnect region 115. Metal line 120 includes any suitable conductive metal, such as copper or aluminum. As discussed, interconnect region 115 includes a plurality of metallization layers and via layers, however only metal line 120 is shown for the sake of clarity. In various examples, interconnect region has about 5 to 8 metallization layers.

Dielectric layer 125 is over the top metallization of interconnect region 115 and surrounds via 130. As shown, a portion of thick metal line 135 is on dielectric layer 125. Via 130 and thick metal line 135 include any suitable conductive material or materials, such as copper or aluminum. In some examples, via 130 and thick metal line 135 are the same material and are formed together as a continuous conductive segment, for example by plate through resist processing. In such cases, although a single segment, a via portion is defined as the portion of the segment surrounded by dielectric material and the metal line portion is defined as the portion above the dielectric material. Thick metal line 135 may have a variety of thicknesses, but in general it is thicker than the metal lines of the other metallization layers. In some examples, thick metal lines 135 have a thickness equal to or greater than about 5 microns. And in various examples, thick metal lines 135 have a thickness in the range of about 5 microns to 15 microns.

Figure 2:
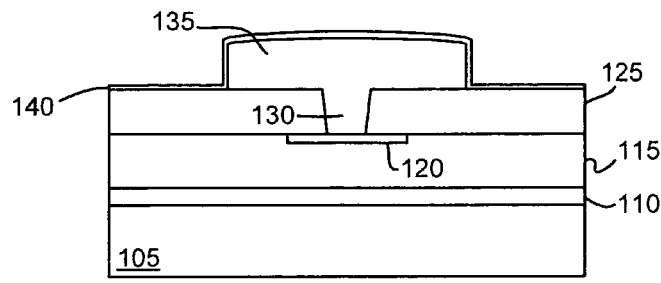
FIG. 2 illustrates the structure of FIG. 1 with a passivation layer formed over the dielectric layer and the thick metal line.

As illustrated in FIG. 2, an optional passivation layer 140 is formed over thick metal line 135 and exposed regions of dielectric layer 125. Passivation layer 140 includes any suitable material or materials that provide a hermetic seal against moisture and ionic contaminants for thick metal line 135. Further, passivation layer 140 provides enhanced adhesion for the subsequent planar dielectric layer. In one example, passivation layer 140 includes a nitride.

Figure 3:
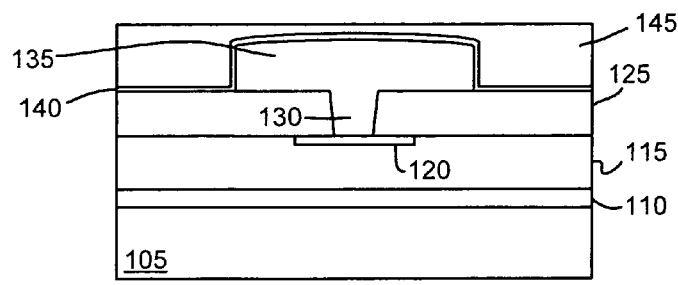
FIG. 3 illustrates the structure of FIG. 2 with a planar dielectric layer formed over the passivation layer.
Figure 4A:
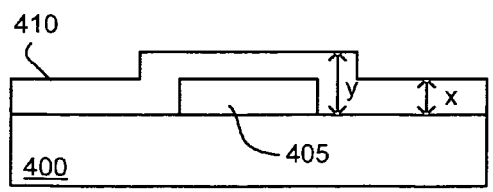
FIG. 4A illustrates a substantially non-planar layer over a body disposed on a substrate.
Figure 4B:
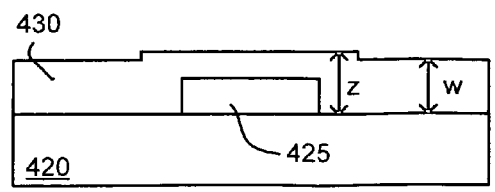
FIG. 4B illustrates a substantially planar layer over a body disposed on a substrate.

Then, as shown in FIG. 3, a planar dielectric layer 145 is formed over thick metal line 135, and the dielectric layer is cured. Planar dielectric layer 145 is formed by any suitable technique, such as spin-on processing. Planar dielectric layer 145 includes any dielectric material that provides good planarity (as discussed below with respect to FIGS. 4A and 4B) and minimal shrinkage during cure, such that its top surface is relatively flat. Planar dielectric layer 145 also has good mechanical properties and is susceptible to an etchant. In one example, planar dielectric layer 145 includes bisbenzocyclobutene (BCB), sold by Dow Chemical under the trade name Cyclotene®.

In FIGS. 4A and 4B, the difference between a relatively planar surface and a relatively non-planar surface is illustrated. In FIG. 4A, a layer 410 is shown over a body 405 on a substrate 400, while FIG. 4B shows a layer 430 over a body 425 on a substrate 420. Layer 410 of FIG. 4A is less planar than layer 430 of FIG. 4B. This can be seen by subjectively analyzing their top surfaces (there is a more pronounced bulge in the layer in FIG. 4A as compared to FIG. 4B). Also, the planarity can be measured by taking the ratio of the height of the layer's top surface at a point over the substrate over the height of the layer's top surface at a point over the bodies. In a non-planar surface the measured ratio is less than the ratio of a planar surface. That is, for non-planar layer 410, the ratio x/y is less than the ratio w/z of relatively planar layer 430—and, in general, a greater ratio relates to a more planar layer. For an ideally planar surface, the ratio is 1.

Although the required planarity for any particular application may vary based on a number of factors, for dielectric patterning over thick metal lines having a thickness of about 5 to 15 microns, a ratio equal to or greater than about 0.8 is preferred. In FIG. 3, the planarity of planar dielectric layer 145 is shown as perfectly planar (a ratio of 1). However, in some examples, the top surface of planar dielectric layer 145 is not perfectly planar. In various examples, the planarity ratio is in the range of about 0.8 to 0.9 or about 0.9 to 0.99.

As discussed, the material of planar dielectric layer 145 also shrinks minimally during cure and has excellent mechanical properties. By shrinking minimally, less than about 10% by volume, planar dielectric layer 145 maintains its planar shape and is resistant to inevitable temperature cycling from subsequent processing, product testing, and product usage. Further, it will provide no or minimal stress on adjacent layers and components during such temperature cycling. Also, planar dielectric layer 145 has excellent mechanical properties, such as high yield strength and high elongation to break. For example, BCB has a tensile strength of about 87 MPa. By being mechanically strong, planar dielectric layer 145 will not be susceptible to cracking during packaging and will lower yield loss and failures of the microelectronic device.

Figure 5:
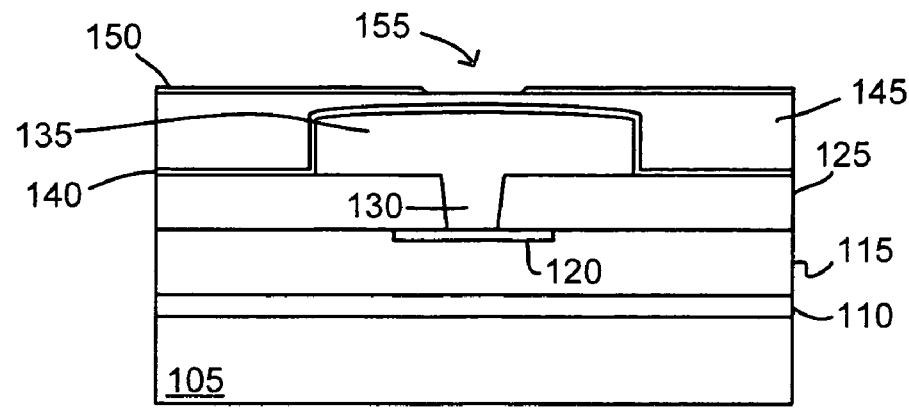
FIG. 5 illustrates the structure of FIG. 3 with a dielectric layer including an opening over the thick metal line formed over the planar dielectric layer.

The method continues from the structure in FIG. 3, as illustrated in FIG. 5 with the deposition (such as by spin-on processing), photo-patterning, developing, and cure of a patterned dielectric layer 150, which includes an opening 155 over planar dielectric layer 145. Patterned dielectric layer 150 includes any suitable dielectric material that is photosensitive with sufficient resolution to pattern features to contact thick metal line 135 and has an etch selectivity relative to planar dielectric layer 145 (and to optional passivation layer 140, if used). Since patterned dielectric layer 150 is relatively thin and due to the presence of planar dielectric layer 145, the material selection of patterned dielectric layer 150 may include materials that do not have good planarity, that shrink, or that do not have a high mechanical strength. In an embodiment, patterned dielectric layer 150 is a polyimide material. In various embodiments, the polyimide after cure has a thickness in the range of about 3 to 10 microns. Polyimide, although providing good mechanical strength (tensile strength in the range of about 100 to 175 MPa), is subject to shrinkage (as much as 50% by volume), and does not provide good planarity. As discussed, patterned dielectric layer 150 is photosensitive to a necessary resolution. Although the resolution required will vary based on the specific application, in various examples, the required critical dimension resolution is in the range of about 5 to 15 microns. In an example, opening 155 has dimensions of about 10 microns by 30 microns. Polyimide can routinely provide such resolution with a broad processing window.

Figure 6:
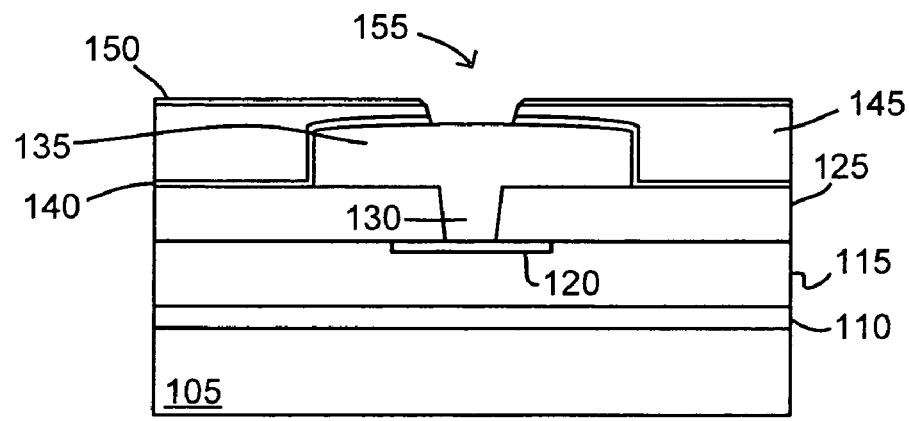
FIG. 6 illustrates the structure of FIG. 5 with portions of the substantially planar dielectric layer and the passivation within the opening removed.

Next, as illustrated in FIG. 6, portions of planar dielectric layer 145 and passivation layer 140, if present, are removed to expose a region of thick metal line 135. Portions of planar dielectric layer 145 and passivation layer 140 are removed by any suitable process, such as wet and dry etch techniques. In one example, portions of planar dielectric layer 145 are removed by an oxygen based plasma etch. In another example, portions of passivation layer 140 are removed by nitride dry etch processing.

Figure 7:
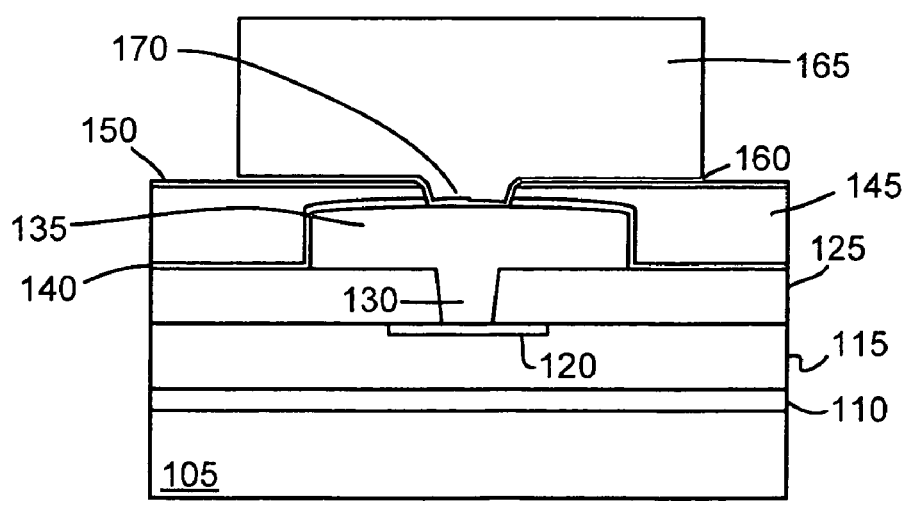
FIG. 7 illustrates the structure of FIG. 6 with an under-bump metallization layer formed within the opening and over portions of the patterned dielectric layer, a via formed in the opening, and a conductive bump formed over the under-bump metallization layer.

The structure of FIG. 6 is suitable for the formation of a conductive via and any of a higher level metallization layer, a landing pad for external connection, or a conductive bump, or the like. In FIG. 7, a conductive via 170, a conductive bump 165 and under-bump metallization 160 are illustrated.

Conductive via 170, conductive bump 165, and under-bump metallization 160 are formed by any suitable process, such as a plate through resist process flow. In a plate through resist technique, a bulk metal layer including under-bump metallization 160 is formed over the substrate surface. Then a resist layer is formed including an opening having the shape of conductive bump 165. Conductive via 170 and conductive bump 165 are then plated within the opening, conforming to the shape of the opening in the resist layer. The resist layer is then removed as is the exposed portion of the bulk metal layer, leaving under-bump metallization 160 under conductive bump 165 as shown in FIG. 7. The structure of FIG. 7 is then ready for attachment to an external substrate, such as by flip-chip packaging technology.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A method comprising:
   forming a thick metal line on a surface of a substrate, wherein the substrate includes a device region and a metallization region and wherein the thick metal line is electrically connected to the metallization region;
   forming a substantially planar first dielectric layer over the substrate surface and the thick metal line, wherein forming the substantially planar first dielectric layer comprises a cure step, and wherein the first dielectric layer shrinks by less than about 10% by volume during the cure step;
   forming a second dielectric layer over the first dielectric layer;
   patterning the second dielectric layer to form an opening in the second dielectric layer to expose a region of the first dielectric layer;
   etching at least a portion of the first dielectric layer within the opening to expose a portion of the thick metal line; and
   forming a conductive via that contacts the thick metal line.

2. The method of claim 1, wherein the thick metal line has a thickness equal to or greater than about 5 microns.

3. The method of claim 1, wherein the opening has a critical dimension of less than or equal to about 10 microns.

4. The method of claim 1, wherein the first dielectric layer comprises bisbenzocyclobutene (BCB).

5. The method of claim 1, wherein a ratio of a first height of the substantially planar first dielectric layer over the substrate over a second distance of the substantially planar first dielectric layer over the thick metal line is greater than about 0.8.

6. The method of claim 1, wherein the second dielectric layer comprises a polyimide.

7. The method of claim 1, wherein etching the first dielectric layer comprises an oxygen plasma etch.

8. The method of claim 1, further comprising:
   forming a nitride passivation layer over the thick metal line and the substrate surface before forming the first dielectric layer over the substrate surface.

9. The method of claim 1, further comprising:
   forming a bump over the conductive via.

10. A method comprising:
    forming a thick metal line on a surface of a substrate, wherein the substrate includes a device region and a metallization region and wherein the thick metal line is electrically connected to the metallization region;
    forming a substantially planar first dielectric layer including bisbenzocyclobutene (BCB) over the substrate surface and the thick metal line;
    forming a second dielectric layer including polyimide over the first dielectric layer;
    patterning the second dielectric layer to form an opening in the second dielectric layer to expose a region of the first dielectric layer;
    etching at least a portion of the first dielectric layer within the opening to expose a portion of the thick metal line; and
    forming a conductive via that contacts the thick metal line, wherein:
    a ratio of a first height of the substantially planar first dielectric layer over the substrate over a second distance of the substantially planar first dielectric layer over the thick metal line is greater than about 0.8.

11. The method of claim 10, wherein the thick metal line has a thickness equal to or greater than about 5 microns.

12. The method of claim 10, wherein the opening has a critical dimension of less than or equal to about 10 microns.

13. The method of claim 10, further comprising:
    forming a bump over the conductive via.

* * * * *